(12) United States Patent
Yamanobe (10) Patent No.: US 6,975,529 B2
(45) Date of Patent: Dec. 13, 2005

(54) FERROELECTRIC MEMORY WITH READ-ONLY MEMORY CELLS, AND FABRICATION METHOD THEREOF

(75) Inventor: Tomomi Yamanobe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 118 days.

(21) Appl. No.: 10/453,484

(22) Filed: Jun. 4, 2003

(65) Prior Publication Data

US 2004/0061155 A1     Apr. 1, 2004

(30) Foreign Application Priority Data

Sep. 27, 2002  (JP) ............................. 2002-282480

(51) Int. Cl.[7] ............................................. G11C 11/22
(52) U.S. Cl. .................... 365/145; 365/189.09; 365/65
(58) Field of Search ........................... 365/145, 189.09, 365/65, 117

(56) References Cited

U.S. PATENT DOCUMENTS 5,953,245 A * 9/1999 Nishimura ................... 365/145
6,392,919 B1 * 5/2002 Higgins et al. .............. 365/145

FOREIGN PATENT DOCUMENTS

| JP | 10150157 A | 6/1998 |
| JP | 2001-094065 | 4/2001 |
| JP | 2003179209 A | 6/2003 |

OTHER PUBLICATIONS

Preparation of Bi-based Ferroelectric Thin Film by Sol-Gel Method Tsutomu Atsuki, Nobuyuki Soyama, Tadashi Yonezawa and Katsumi Ogi Jpn. J. Appl. Phys. vol. 34 (1995) pp. 5096-5099 Sep. 1995.

* cited by examiner

Primary Examiner—David Lam
(74) Attorney, Agent, or Firm—Volentine Francos & Whitt, PLLC

(57) ABSTRACT

A ferroelectric memory includes read-write memory cells having a comparatively weak imprint characteristic and read-only memory cells having a comparatively strong imprint characteristic. Data written in the read-only memory cells are imprinted by, for example, writing the same data repeatedly, after which the imprinted data cannot be altered at the normal read-write voltage. The memory can be fabricated by forming a first base layer and a second base layer having different chemical compositions, and forming ferroelectric capacitors on the different base layers. The first and second base layers may serve as adhesion layers promoting adhesion between lower electrodes of the ferroelectric capacitors and an underlying insulation layer. The ferroelectric capacitors may include a ferroelectric film having a constituent metallic element present in the second base film but not in the first base film.

5 Claims, 8 Drawing Sheets

FERROELECTRIC MEMORY WITH READ-ONLY MEMORY CELLS, AND FABRICATION METHOD THEREOF

BACKGROUND OF THE INVENTION

1. Field of the Invention

The present invention relates to a ferroelectric memory device. More particularly, the invention relates to a ferroelectric memory device having a group of memory cells that can be placed in a state in which the contents of the memory cells cannot be rewritten at a normal operating voltage. The invention also relates to a fabrication method for this type of ferroelectric memory device.

2. Description of the Related Art

Known ferroelectric memory devices are described in Japanese Unexamined Patent Application Publication No. 2001-94065 (hereinafter, Reference 1) and in 'Preparation of Bi-Biased Ferroelectric Thin Films by Sol-Gel Method' by Atsuki et al., Japan Journal of Applied Physics, Vol. 34, Part I, No. 9B (September 1995), pp. 5096–5099 (hereinafter, Reference 2).

Ferroelectric materials exhibit a charge polarization that is reversible by an electric field, and retain a fixed remanent polarization even after the electric field returns to zero. These properties are used in nonvolatile ferroelectric memories having ferroelectric materials as capacitor dielectrics.

Ferroelectric memories are generally used as read-write memories for storing variable data, such as user data, that may need to be altered from time to time. Devices such as microcontrollers, however, also require read-only memories for storing fixed data such as program code. It would therefore be desirable to have a ferroelectric memory including a read-only area.

SUMMARY OF THE INVENTION

An object of the present invention is to provide a ferroelectric memory having both read-write memory cells and read-only memory cells.

The invented ferroelectric memory includes a first memory cell having a first imprint characteristic and a second memory cell having a second imprint characteristic, weaker than the first imprint characteristic. Data can be written and erased in the second memory cell by applying voltages in a predetermined operating voltage range. The first memory cell stores imprinted data that cannot be altered by application of voltages in the predetermined operating voltage range.

In a preferred embodiment of the invention, the first memory cell includes a first ferroelectric capacitor formed on a first base layer, and the second memory cell includes a second ferroelectric capacitor formed on a second base layer. The first and second base layers have different chemical compositions. The second base layer preferably includes a metallic element found in the ferroelectric film in the second ferroelectric capacitor and the first base layer may include an element not found in the ferroelectric film in the first ferroelectric capacitor.

The invention also provides a fabrication method for the invented ferroelectric memory. Basically, the method comprises forming a first region with at least one first memory cell and a second region with at least one second memory cell as described above, then imprinting data in the first region. The data may be imprinted by, for example, heating the ferroelectric memory, or by writing the same data repeatedly.

In the preferred embodiment, the fabrication method includes the steps of:

forming an insulation film on a semiconductor substrate;

forming a first base layer and a second base layer, having different chemical compositions, on the insulation film;

forming a first electrode film on the first and second base layers;

forming a ferroelectric film on the first electrode film;

forming a second electrode film on the ferroelectric film; and patterning the first electrode film, the ferroelectric film, and the second electrode film to form at least one first ferroelectric capacitor and at least one second ferroelectric capacitor.

The ferroelectric film may include a metallic element found in the second base layer but not in the first base layer. Diffusion of different elements from the first and second base layers into the ferroelectric film gives the first ferroelectric capacitor a stronger imprint characteristic than the second ferroelectric capacitor.

The semiconductor substrate may include transistors that are interconnected to the first and second capacitors to form first and second memory cells.

The invented ferroelectric memory typically includes a plurality of first memory cells with a comparatively strong imprint characteristic and a plurality of second memory cells with a comparatively weak imprint characteristic. The first memory cells can be employed as a read-only memory for storing fixed data such as computer program code, while the second memory cells are used as a read-write memory for storing variable data such as user data. The invented ferroelectric memory is accordingly suitable for use in microcontrollers.

DETAILED DESCRIPTION OF THE INVENTION

Embodiments of the invention will now be described with reference to the attached drawings, in which like elements are indicated by like reference characters.

Figure 1:
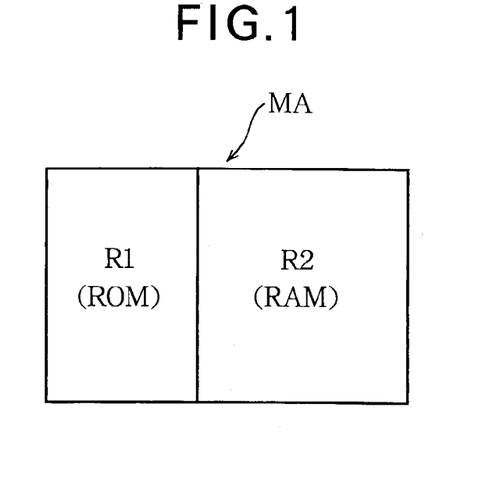
FIG. 1 illustrates the memory cell array of a ferroelectric memory device embodying the present invention.

FIG. 1 is a plan view of the general layout of the memory cell array of a ferroelectric memory device embodying the present invention. The memory cell array MA includes a first region R1 and a second region R2. A group of ferroelectric memory cells of a first type are formed in the first region R1. A group of ferroelectric memory cells of a second type are formed in the second region R2.

Figure 2:
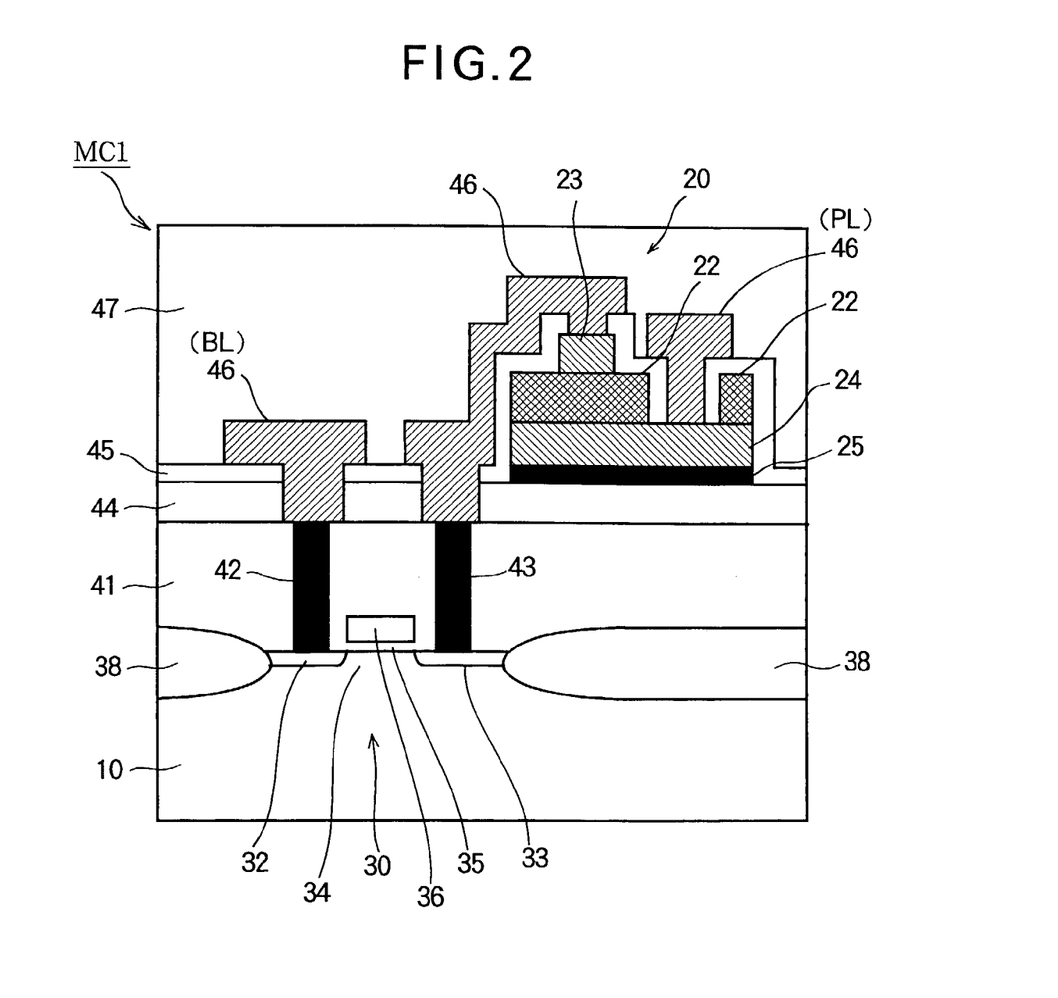
FIG. 2 is a sectional view of a memory cell in a first region in the memory cell array.
Figure 3:
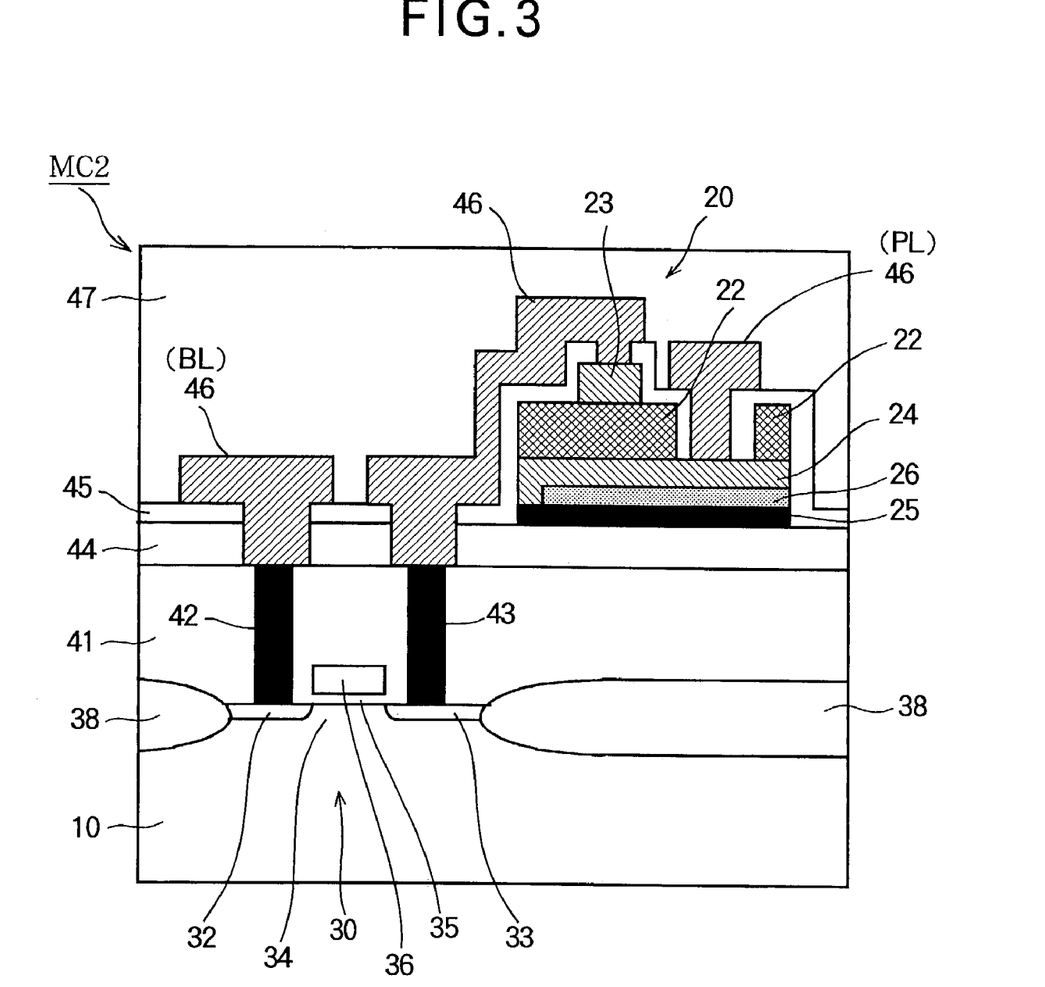
FIG. 3 is a sectional view of a memory cell in a second region in the memory cell array.

FIG. 2 is a sectional view of a first ferroelectric memory cell MC1 formed in the first region R1. FIG. 3 is a sectional view of a second ferroelectric memory cell MC2 formed in the second region R2.

As shown in FIG. 2, the first ferroelectric memory cell MC1 includes a ferroelectric capacitor 20 and a metal-oxide-semiconductor field-effect transistor (MOSFET) 30. The ferroelectric capacitor 20 includes a ferroelectric film 22, an upper electrode 23 disposed on the ferroelectric film 22, and a lower electrode 24 disposed under the ferroelectric film 22.

The MOSFET 30 includes a drain 32 and a source 33 formed at the surface of a silicon substrate 10, a channel region 34 disposed between the drain 32 and the source 33, and a gate insulation film 35 and gate electrode 36 disposed above the channel region 34. The MOSFET 30 is isolated from other devices such as other similar MOSFETs (not shown) by a field isolation film 38.

A first interlayer insulation film 41 covers the silicon substrate 10, field isolation film 38, and gate electrode 36. A second interlayer insulation film 44 formed as a silicon oxide ($SiO_2$) film, for example, is disposed on the first interlayer insulation film 41. Contact plugs 42 and 43 are formed in holes penetrating the first interlayer insulation film 41 and making electrical contact with the drain 32 and source 33 of the MOSFET 30. The contact plugs 42 and 43 may be formed of tungsten, for example.

A first adhesion layer 25 is formed on part of the second interlayer insulation film 44, providing a base layer on which the lower electrode 24 of the ferroelectric capacitor 20 is formed. A third interlayer insulation film 45 is formed on other parts of the second interlayer insulation film 44 and on the ferroelectric capacitor 20, including the upper electrode 23. A first metal interconnection layer 46 is disposed on the third interlayer insulation film 45. An intermetal insulation film 47 covers the first metal interconnection layer 46. A second metal interconnection layer (not shown) is disposed on the intermetal insulation film 47.

The first metal interconnection layer 46 includes parts that extend through the second interlayer insulation film 44 and third interlayer insulation film 45 to make electrical contact with the upper ends of the contact plugs 42 and 43. Another part of the first metal interconnection layer 46 extends through a contact hole 28 (shown in FIG. 8B) in the ferroelectric film 22, and makes electrical contact with the lower electrode 24. The part of the first metal interconnection layer 46 connected to the drain 32 through contact plug 42 constitutes a bit line (BL). The part of the first metal interconnection layer 46 connected to the lower electrode 24 constitutes a plate line (PL). The gate electrode 36 is connected to a word line (WL, shown in FIG. 5) in the second metal interconnection layer.

The ferroelectric film 22 is formed of a ferroelectric material such as $SrBi_2Ta_2O_9$ (SBT), and has a thickness of, for example, approximately two hundred fifty to three hundred nanometers (250 to 300 nm). The upper electrode 23 is formed of platinum (Pt) and has a thickness of, for example, approximately 200 nm. The lower electrode 24 is also formed of platinum and has a thickness of, for example, approximately 200 nm.

The first adhesion layer 25 is formed of a material such as titanium oxide ($TiO_x$) and preferably has a thickness of approximately 40 to 100 nm. The thickness of the first adhesion layer 25 may be approximately 80 nm, for example. The first adhesion layer 25 is interposed between the second interlayer insulation film 44 and the lower electrode 24 to make the lower electrode 24 adhere to the second interlayer insulation film 44. This is necessary because the platinum that constitutes the lower electrode 24 is stable even at high temperatures and normally does not adhere well to the silicon oxide that constitutes the second interlayer insulation film 44. Another purpose of the first adhesion layer 25 in this embodiment is to strengthen an imprint characteristic that will be described below. The first adhesion layer or base layer 25 in this embodiment includes an element (titanium, Ti) not intrinsically found in the SBT ferroelectric film 22 of the first type memory cell MC1.

As shown in FIG. 3, the second-type ferroelectric memory cell MC2 has substantially the same structure as the first-type ferroelectric memory cell MC1. However, the second-type ferroelectric memory cell MC2 differs from the first-type ferroelectric memory cell MC1 in that a second adhesion layer or base layer 26 is interposed between the first adhesion layer 25 and the lower electrode 24. The second adhesion layer 26 is formed of a material such as tantalum oxide ($TaO_x$) and preferably has a thickness of approximately 20 to 100 nm. The thickness of the second adhesion layer 26 may be set to approximately 50 nm, for example. Like the first adhesion layer 25, the second adhesion layer 26 improves adhesion between the lower electrode 24 and the second interlayer insulation film 44; another purpose of the second adhesion layer 26 is to prevent the first adhesion layer 25 from strengthening the imprint characteristic of the ferroelectric film 22.

In this embodiment, the ferroelectric film 22, the first adhesion layer 25, and the second adhesion layer 26 all include metal oxides, but whereas the first adhesion layer 25 includes titanium (Ti), the second adhesion layer 26 and the ferroelectric film 22 include tantalum (Ta). During the formation of the ferroelectric capacitor, in a ferroelectric memory cell MC1 of the first type, titanium diffuses from the first adhesion layer 25 into the SBT ferroelectric film 22 where it becomes a foreign element degrading the polarization characteristic of the ferroelectric film. The deterioration of the polarization characteristic of the ferroelectric film 22 is accompanied by a strengthening of the imprint characteristic of the ferroelectric memory cells in the first region, making it difficult to reverse the polarization after data have been written.

In a ferroelectric memory cell MC2 of the second type, however, the first adhesion layer 25 is overlain by the second adhesion layer 26, which includes tantalum instead of titanium. Since tantalum is intrinsically present in the SBT ferroelectric film 22, and thus is not a foreign element, diffusion of tantalum from the second adhesion layer 26 into the ferroelectric film 22 during the formation of the ferroelectric capacitor does not significantly degrade the polarization characteristic of the ferroelectric film. By substantially covering the first adhesion layer 25, the second adhesion layer 26 substantially prevents the diffusion of titanium into the ferroelectric film 22, thereby preventing the deterioration of its polarization characteristics and the attendant strengthening of its imprint characteristic.

As described above, the lower electrode 24 of the ferroelectric capacitor 20 is in direct contact with the $TaO_x$ constituting the second adhesion layer 26 in the second ferroelectric memory cell MC2, but is in direct contact with the TiO$_x$ constituting the first adhesion layer 25 in the first ferroelectric memory cell MC1. As a result, the second ferroelectric memory cell MC2 has a generally normal imprint characteristic, that is, a comparatively weak imprint characteristic. Accordingly, the second ferroelectric memory cell MC2 has a long imprint life, and can be employed as a read-write memory cell. In particular, the second ferroelectric memory cell MC2 can be employed in a random-access memory (RAM).

On the other hand, the first ferroelectric memory cell MC1 has a comparatively strong imprint characteristic. If the same data value is written repeatedly or the memory cell is kept at a high temperature for a long time after data writing, it becomes impossible to change the contents of the memory cell at the normal writing voltage. To rewrite the data in the first ferroelectric memory cell MC1, a voltage higher than any voltage encountered in normal operation is required. The first ferroelectric memory cell MC1 can accordingly be employed in a read-only memory (ROM).

Figure 4A:
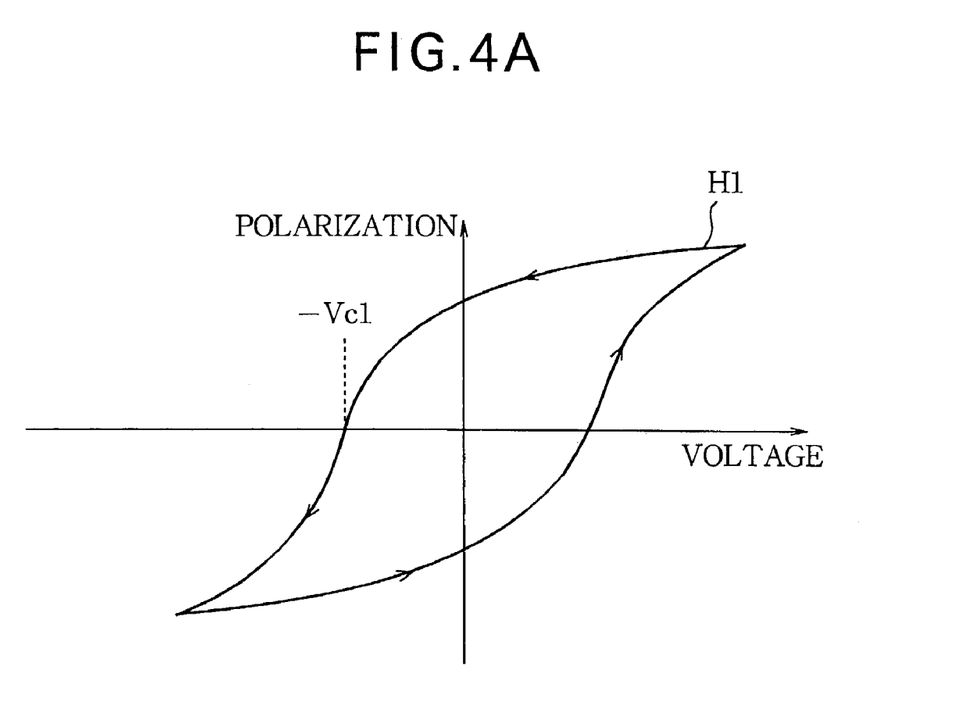
FIGS. 4A and 4B illustrate polarization characteristics of ferroelectric films.
Figure 4B:
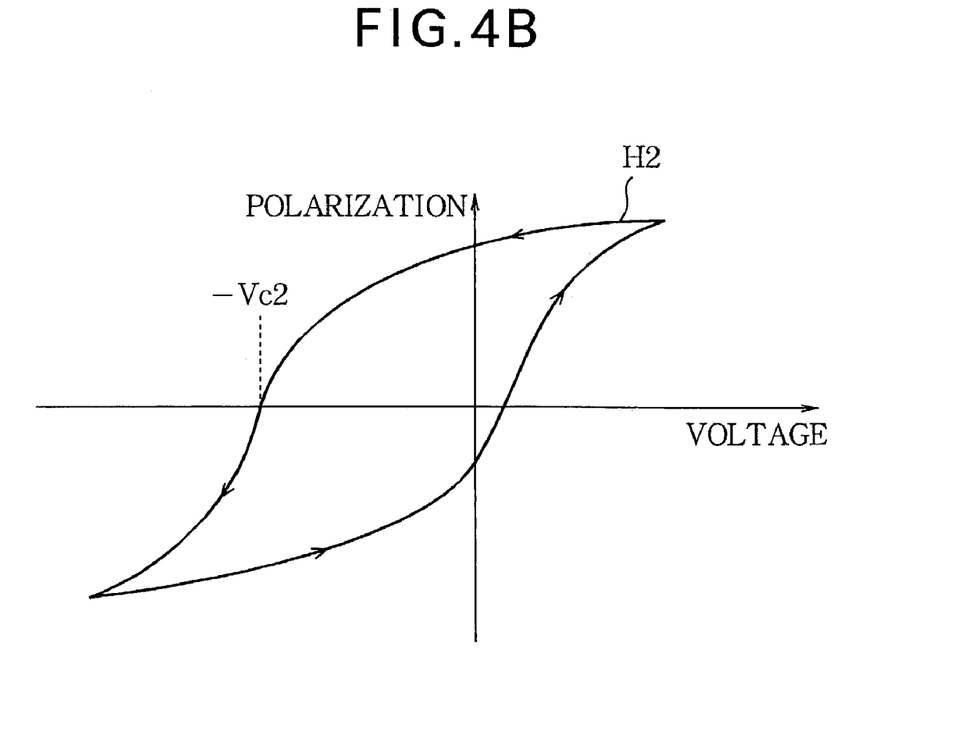

The imprint characteristic describes the tendency of a ferroelectric capacitor to become stuck in one polarization state if the same data value is written repeatedly, or if the capacitor is held at a high temperature after the data writing operation. A ferroelectric capacitor in which this phenomenon occurs easily is said to have a high or strong imprint characteristic. The imprint characteristic is represented by a shift of a hysteresis curve along the voltage axis, as shown in FIGS. 4A and 4B. When a positive voltage, for example, is applied repeatedly to a ferromagnetic capacitor having the basic hysteresis characteristic represented by curve H1 in FIG. 4A, not only does the capacitor become polarized in the positive direction (the upward direction in the drawing); its hysteresis curve is also shifted toward the left, to the position of curve H2 in FIG. 4B. In order to reverse the polarization, a negative voltage of more than −Vc2 now needs to be applied. The corresponding voltage in FIG. 4A is only −Vc1, where |−Vc2|>|−Vc1|.

It is thought that the imprint characteristic arises when space charges resulting from film defects become trapped by spontaneous polarization. Furthermore, it is known that the electrode materials of the ferroelectric capacitor and the quality of its ferroelectric film, including interface conditions with the capacitor electrodes, are associated with this phenomenon.

It is shown in the above-mentioned Reference 1 that the amount of the spontaneous polarization differs depending on the composition ratio of the ferroelectric material (SrBi$_2$Ta$_2$O$_9$ in the present embodiment) and the materials of the adhesion layers underlying the lower electrode, and that the imprint characteristic is also related to the materials of these adhesion layers. The reason for this is considered to be that the materials of the adhesion layers under the lower electrode penetrate through the lower electrode and diffuse into the ferroelectric film during annealing. When the lower electrode is formed of platinum and the adhesion layer under and in direct contact with the lower electrode is formed of TiO$_x$, the ferroelectric capacitor has a strong tendency to undergo alteration of its imprint characteristic as described above. The reason is that TiO$_x$ is incompletely oxidized and is therefore unstable; titanium atoms tend to separate from oxygen atoms, penetrate through the platinum electrode, and reach the ferroelectric film.

On the other hand, when TaO$_x$ is disposed under and in direct contact with the lower electrode, the above-described mechanism of increasing the imprint characteristic does not operate to any great extent.

Figure 5:
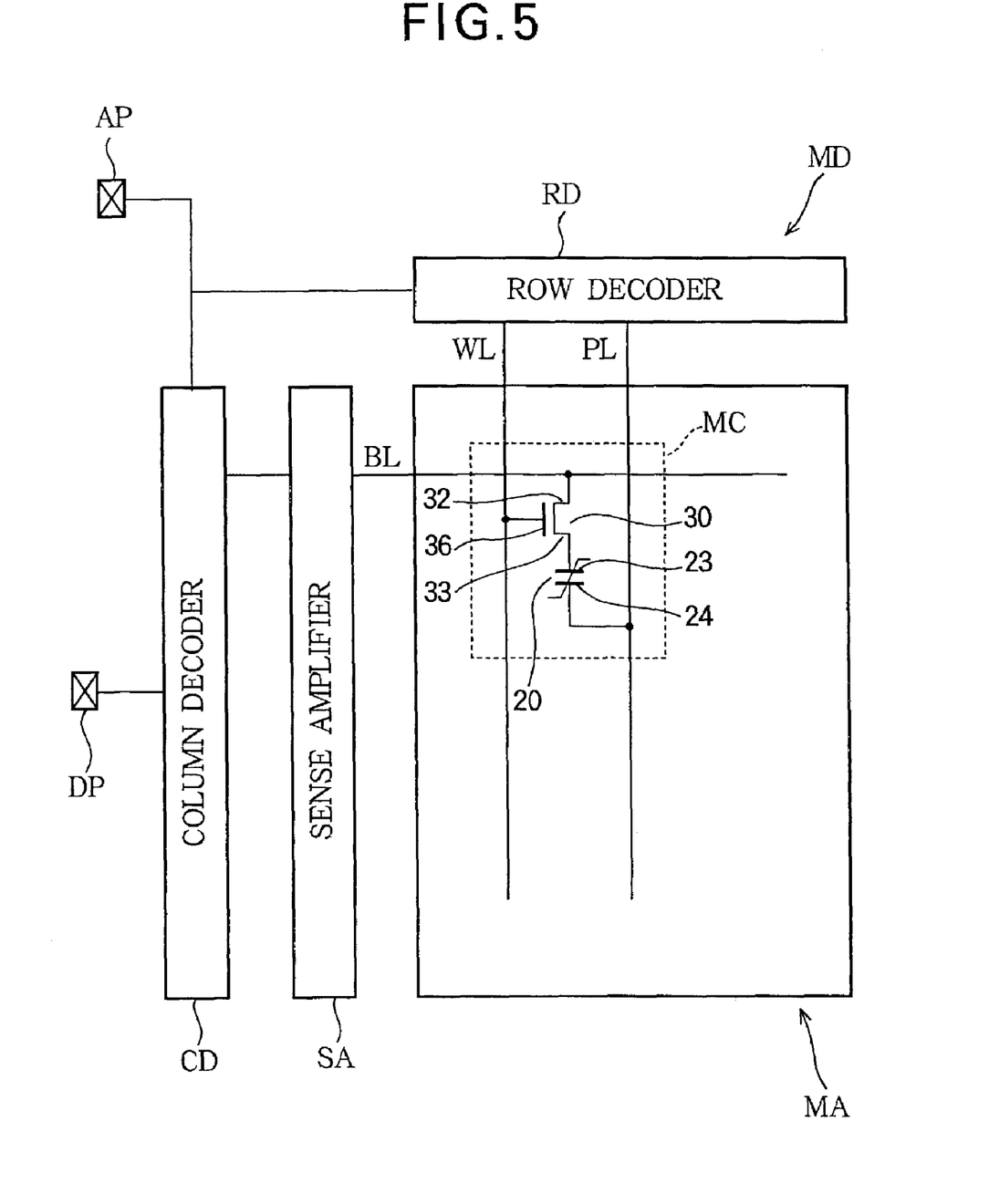
FIG. 5 is a schematic block diagram of the memory cell array and driving circuits for the memory cell array.

FIG. 5 shows the memory cell array MA of the ferroelectric memory device and its driving circuits. In FIG. 5, only one memory cell in the memory cell array MA is shown; other cells are omitted. The memory cell MC in FIG. 5 may be either a first-type memory cell MC1 as shown in FIG. 2 or a second-type memory cell MC2 as shown in FIG. 3. The interconnections for a first-type memory cell MC1 and a second-type memory cell MC2 are identical, so in FIG. 5, both types of the memory cells are generically denoted MC. The memory cell MC shown in FIG. 5 is referred to as a single-transistor-single-capacitor (1T1C) cell, since it has one MOSFET 30 and one ferroelectric capacitor 20. The present invention, however, can also be applied to a 2T2C cell having two MOSFETs and two ferroelectric capacitors, where the two ferroelectric capacitors are polarized in mutually opposite directions and store data representing opposite values.

One of the electrodes of the ferroelectric capacitor 20 (the lower electrode 24) is connected to a plate line PL, while the other electrode of the ferroelectric capacitor 20 (the upper electrode 23) is connected to the source 33 of the MOSFET 30. The drain 32 of the MOSFET 30 is connected to a bit line BL, and the gate electrode 36 of the MOSFET 30 is connected to a word line WL. The word line WL and the plate line PL are connected to a row decoder RD. The bit line BL is connected to a column decoder CD through a sense amplifier SA. Though only one memory cell MC, one word line WL, one plate line PL, and one bit line BL are shown in FIG. 5, a plurality of word lines, plate lines, and bit lines are actually present. The individual word lines, plate lines, and bit lines are selected by the row decoder RD and the column decoder CD.

When the ferroelectric capacitor 20 is polarized in one direction to store data indicating a certain value (e.g., '1'), a positive voltage is supplied to the bit line BL and the word line WL, and a zero voltage is supplied to the plate line PL. When the ferroelectric capacitor 20 is polarized in the other direction to store different data (e.g., '0'), a positive voltage is supplied to the plate line PL and the word line WL, and the zero voltage is supplied to the bit line BL.

In one aspect of the present invention, data are written into memory cells MC in region R1 in FIG. 1 during the manufacture of the ferromagnetic memory device. A data pad DP and an address pad AP are provided for this purpose. These pads can be contacted by external probes (not shown). Referring to FIG. 5, data input from the data pad DP are supplied to the drain 32 of the MOSFET 30 in the memory cell MC through the bit line BL, which is selected by the column decoder CD according to address data supplied through the address pad AP. The row decoder RD drives the word line WL and the plate line PL according to the address data. Desired data can thus be written into a specific memory cell MC by supplying a voltage corresponding to the data to the data pad DP, and supplying an address for selecting the memory cell MC to the address pad AP.

A method of fabricating a ferroelectric memory device embodying the present invention will now be described with reference to FIGS. 6A–6D, 7A–7C, 8A–8C, 9A, and 9B. For simplicity, these drawings show the first memory cell MC1 and the second memory cell MC2 side by side. In an actual memory device, memory cells MC1 and MC2 may be more widely separated, memory cell MC1 being disposed at an arbitrary location in the first region R1 and memory cell MC1 at an arbitrary location in the second region R2 in the memory cell array MA.

Figure 6A:
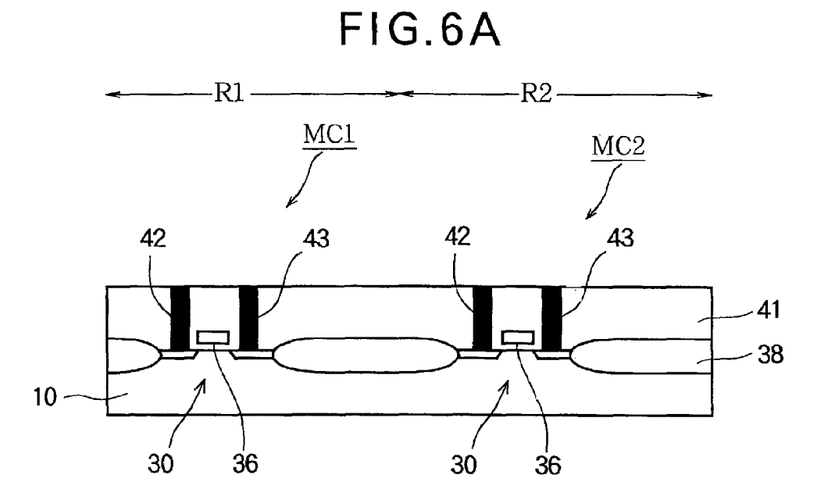
FIGS. 6A, 6B, 6C, and 6D are sectional diagrams showing steps in the fabrication of a ferroelectric memory device according to the present invention.

First, as shown in FIG. 6A, a silicon semiconductor substrate such as a wafer substrate is processed to form MOSFETs 30, including their gate electrodes 36. The first interlayer insulation film 41 is deposited and selectively etched to form contact holes, and contact plugs 42 and 43 comprising an electrically conductive material such as tungsten are formed in the contact holes.

Figure 6B:
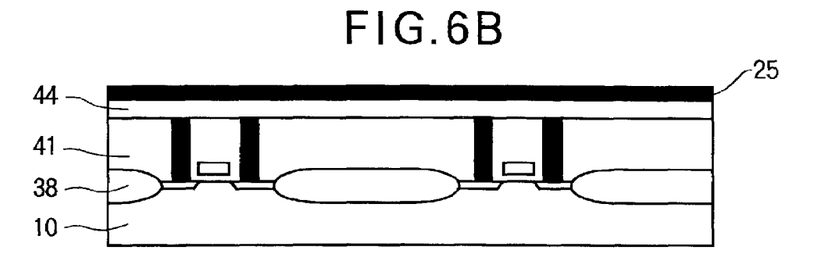

Next, the second interlayer insulation film 44 is deposited on the first interlayer insulation film 41, as shown in FIG. 6B; then the $TiO_x$ first adhesion layer 25 is formed on the second insulation film 44 by sputtering titanium and annealing the resulting titanium film in an oxygen atmosphere. The sputtering and annealing process parameters may be selected to yield a first adhesion layer approximately 80 nm thick.

Figure 6C:
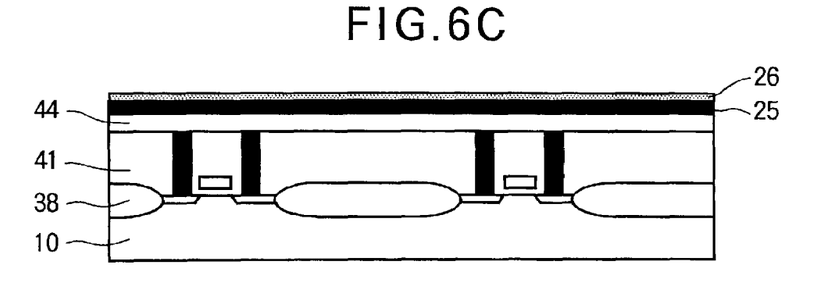

Next, the $TaO_x$ second adhesion layer 26 is formed on the $TiO_x$ first adhesion layer within the second region R2 by sputtering a layer of tantalum as shown in FIG. 6C, patterning the Ta layer by selective etching in a $Cl_2$-based atmosphere, and then annealing the resulting tantalum film in an oxygen atmosphere. The sputtering and annealing process parameters may be selected to yield a second adhesion layer 26 approximately 50 nm thick.

Figure 6D:
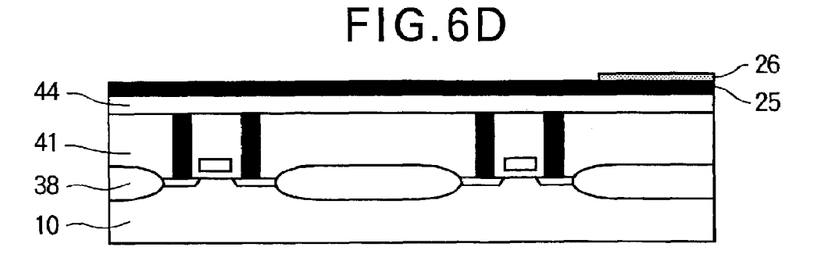

The resulting second adhesion layer 26 comprises $TaO_x$ patterns, one of which is shown in FIG. 6D, each pattern having an area that is preferably smaller than the area of the corresponding pattern to which the ferroelectric film 22, the lower electrode 24, and the first adhesion layer 25 will be etched in the single step described below with reference to FIG. 8A. If the pattern area of the $TaO_x$ second adhesion layer 26 is larger than this single-step pattern area, the $TaO_x$ second adhesion layer 26 will also be etched during the single-step process. The processing time of the $TiO_x$ layer 25 will then vary between the first and second regions R1 and R2, depending on whether the $TaO_x$ layer 26 is present in the region or not, making it impossible to process the entire $TiO_x$ layer 25 in a uniform way. Reducing the pattern area of the $TaO_x$ layer 26 as described above eliminates this problem.

Figure 7A:
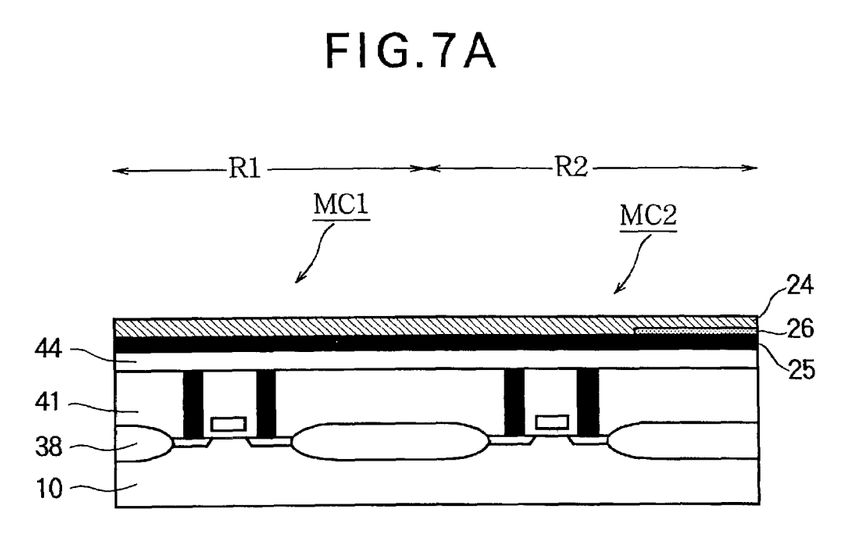
FIGS. 7A, 7B, and 7C are sectional diagrams showing further steps in the fabrication of the ferroelectric memory device.

After the $TaO_x$ layer 26 has been formed, a lower platinum layer that will become the lower electrode 24 is formed by sputtering, as shown in FIG. 7A. The sputtering parameters may be selected to yield a lower platinum layer approximately 200 nm thick.

Figure 7B:
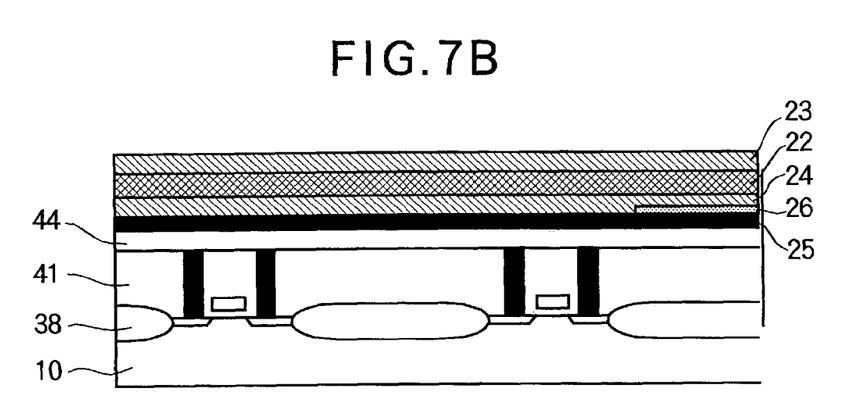

Next, a film of SBT ferromagnetic material is formed by spin-coating in a sol-gel solution, for example, then annealed by heating to a temperature of 750° C. to 800° C. in an oxygen atmosphere. The annealing crystallizes the SBT ferromagnetic material to form a ferroelectric layer that will become the ferroelectric film 22, as shown in FIG. 7B. The process parameters may be selected to yield a ferroelectric film approximately 250 to 300 nm thick.

Next, an upper platinum layer that will become the upper electrode 23 is formed, as shown in FIG. 7B. The process parameters may be selected to yield an upper platinum layer approximately 200 nm thick. This step completes the layered structure of the ferroelectric capacitors 20 as shown in FIG. 7B.

Figure 7C:
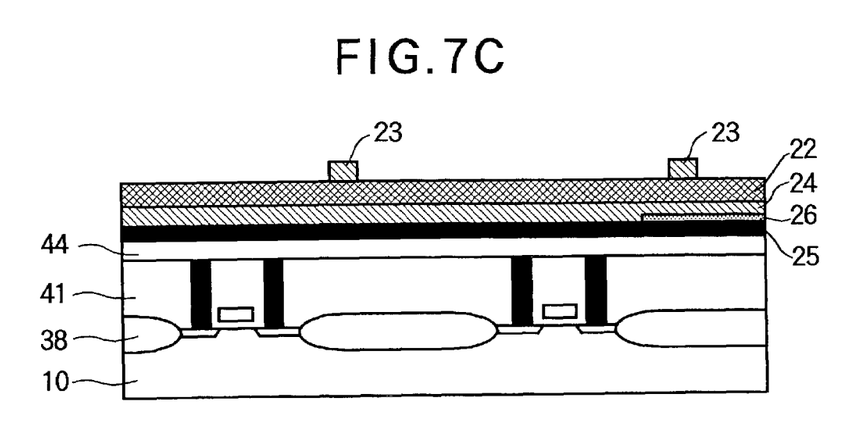

Next, the upper platinum layer is patterned by etching in a $Cl_2$-based atmosphere, thereby forming the upper electrode 23 of each ferroelectric capacitor 20, as shown in FIG. 7C.

Figure 8A:
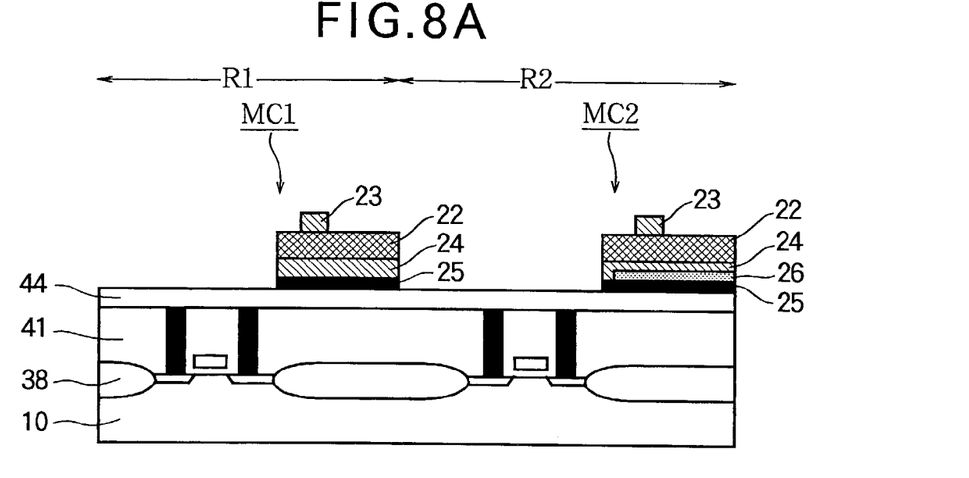
FIGS. 8A, 8B, and 8C are sectional diagrams showing still further steps in the fabrication of the ferroelectric memory device.

Next, the ferroelectric layer, the lower platinum layer, and the first adhesion layer 25 are patterned by a single etching step, thereby forming the ferroelectric film 22 and lower electrode 24 of each ferroelectric capacitor 20, and patterning the first adhesion layer 25, as shown in FIG. 8A.

Figure 8B:
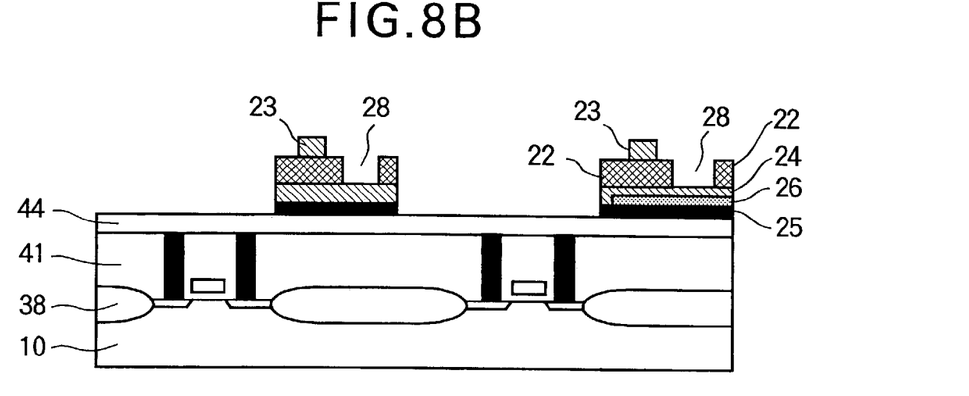

The ferroelectric film 22 is now etched to form the contact holes 28, shown in FIG. 8B, that will be used to connect the first metal interconnection layer 46 to the lower electrode 24.

The above process steps create ferroelectric capacitors 20 with the structure shown in FIG. 8B. In each memory cell MC1 in the first region R1, the lower electrode 24 is in direct contact with the $TiO_x$ first adhesion layer 25, while in each memory cell MC2 in the second region R2, the lower electrode 24 is in direct contact with the $TaO_x$ second adhesion layer 26.

Figure 8C:
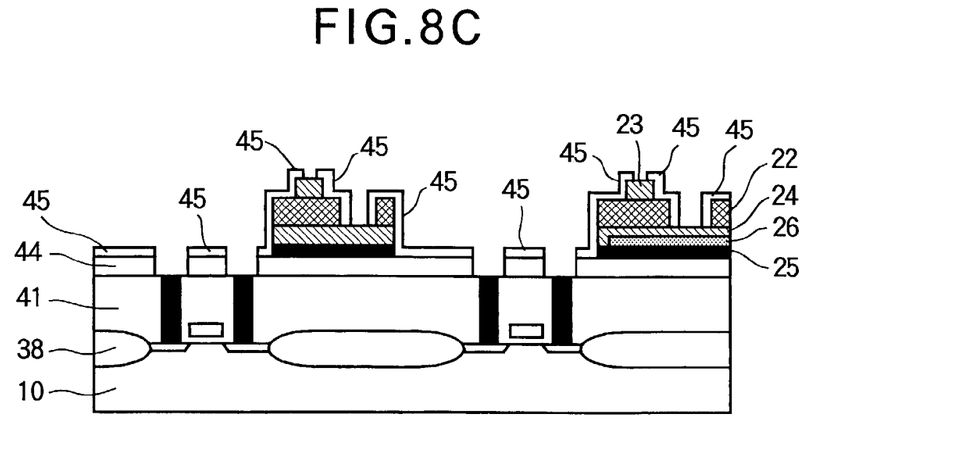
Figure 9A:
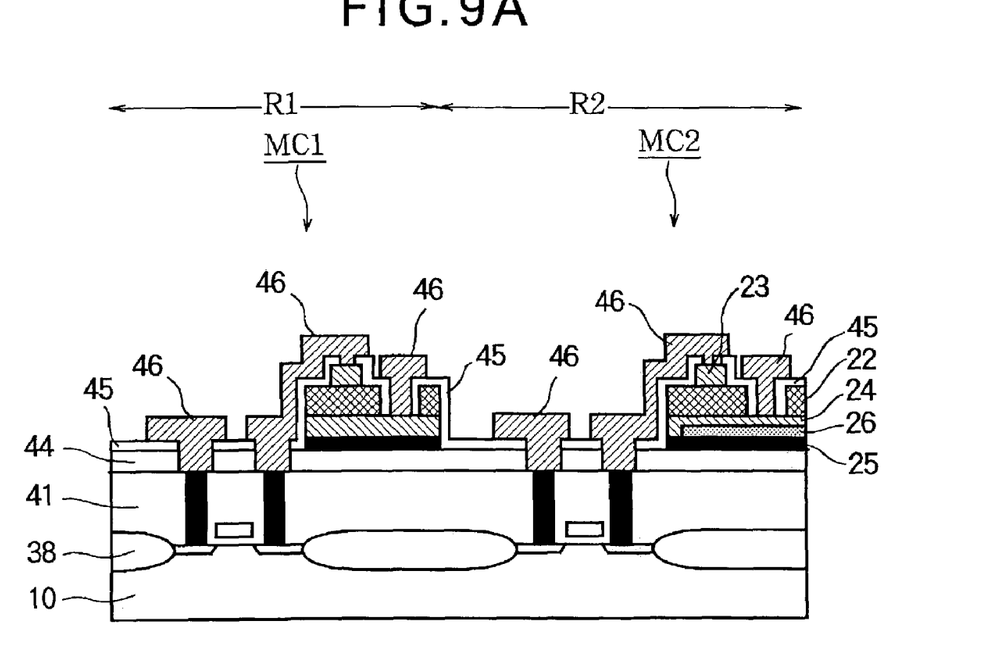
FIGS. 9A and 9B are sectional diagrams showing yet further steps in the fabrication of the ferroelectric memory device.
Figure 9B:
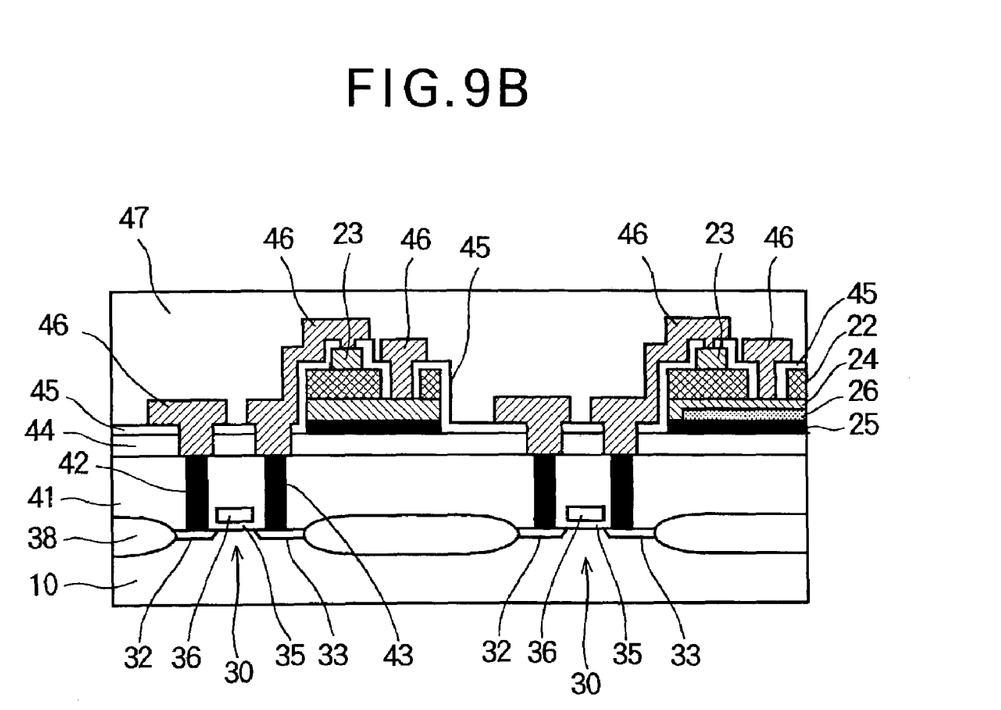

Next, the third interlayer insulation film 45 is deposited and patterned as shown in FIG. 8C. The second insulation film 44 is also patterned at this time. The first metal interconnection layer 46 is now deposited and patterned to produce the wiring structure shown in FIG. 9A. The inter-metal insulation film 47 is then deposited and planarized as shown in FIG. 9B, and a second metal wiring layer (not shown) is formed thereon.

Next, desired data such as computer program code is stored in the memory cells in the first region R1 by one of the following two methods.

In the first method, a voltage corresponding to the desired data is applied to the ferroelectric capacitor 20 of each ferrorelectric memory cell MC1 to polarize its ferroelectric film 22. Then the ferroelectric memory is heated to a temperature such as approximately 85° C. and held at this temperature for several hours. After this heating period, not only do the ferroelectric capacitors 20 in the memory cells MC1 in the first region R1 retain their polarization state; their hysteresis curves are also shifted as shown in FIG. 4B, so that their polarization states cannot be reversed by applying voltages in the normal operating voltage range of the ferroelectric memory. The written data are thereby imprinted.

When this imprinting method is used, the data are written in the memory cells MC1 in the wafer state, before the wafer is diced into integrated circuit (IC) chips and metal leads are attached. The data pad DP and the address pad AP shown in FIG. 5 are provided for this purpose. These pads are contacted by probes, and the data to be written and addresses for selecting associated memory cells are supplied from an external source through the probes.

In the second method, a voltage of the polarity corresponding to the desired data value is applied to the ferroelectric capacitor 20 of each ferroelectric memory cell MC1 repetitively, one hundred or more times, for example. At the completion of the repetitive data writing operation, the ferroelectric capacitors 20 in the memory cells MC1 in the first region R1 retain their polarization state and their hysteresis curves are shifted as shown in FIG. 4B, imprinting the data so that the data cannot be altered within the normal operating voltage range of the ferroelectric memory.

This data writing operation may be performed either in the wafer state, or after the wafer has been diced into IC chips. If the data writing operation is performed in the wafer state, the data pad DP and the address pad AP are formed as shown in FIG. 5 and used as described above to supply data and addresses through external probes.

If the data writing operation is performed in the IC chip state, after packaging of the microcontrollers or other IC devices including the ferroelectric memory, for example, the ferroelectric memory may receive the necessary data and addresses from the another circuit in the normal manner, through external connection terminals such as leads. Alternatively, a circuit for generating part or all of the data or addresses in response to an externally supplied control signal may be formed within each IC, and the data writing operation may be performed using data and addresses generated inside the IC. In either case, the data pad DP and address pad AP shown in FIG. 5 are unnecessary.

As described above, the memory cells MC1 in the first region can be employed as a read-only memory for storing fixed data such as program code, which in general must not be erased. The memory cells MC2 in the second region R2 can be employed as a nonvolatile read-write memory for storing user data and other variable data in an alterable manner.

In the embodiment above, in the second memory region R2, the first adhesion layer 25 is interposed between the second adhesion layer 26 and the first interlayer insulation film 41. In a variation of this embodiment, the second adhesion layer 26 is formed directly on the first interlayer insulation film 41 in the second memory region R2, the first adhesion layer 25 not being present in this region.

In the embodiment above, a $TiO_x$ adhesion layer 25 and a $TaO_x$ adhesion layer 26 were employed to form a first memory cell MC1 and a second memory cell MC2 with mutually different imprint characteristics. The adhesion layers are not limited to these particular materials, however; the adhesion layer materials may be varied according to the composition of the ferroelectric film 22. Instead of titanium, the first adhesion layer 25, for example, may incorporate another element not present in the ferroelectric film 22, and instead of tantalum, the second adhesion layer 26 may incorporate another element present in the ferroelectric film 22.

The invention thus provides a first method of fabricating a ferroelectric memory device, the method comprising:

forming a group of first-type ferroelectric memory cells having a comparatively strong imprint characteristic and a group of second-type ferroelectric memory cells having a comparatively weak imprint characteristic; and imprinting desired data in the group of the first-type ferroelectric memory cells, leaving the first-type ferroelectric memory cells in a state wherein the data imprinted therein cannot be altered within a normal operating voltage range of the ferroelectric memory device.

The invention also provides a second method, based on the first method, wherein imprinting desired data further comprises:

writing the desired data by applying corresponding voltages to the first-type ferroelectric memory cells; and holding the ferroelectric memory device at a predetermined temperature for a predetermined time.

The invention also provides a third method, based on the second method, wherein the predetermined temperature is substantially 85° C.

The invention also provides a fourth method, based on the third method, wherein the predetermined time includes a plurality of hours.

The invention also provides a fifth method, based on the first method, wherein imprinting desired data further comprises writing the desired data repeatedly.

The invention also provides a sixth method, based on the fifth method, wherein the desired data are written substantially one hundred times or more.

The invention also provides a seventh method, based on the first method, wherein forming the groups of first-type and second-type ferroelectric memory cells further comprises:

forming an insulation film on a semiconductor substrate;

forming a first base layer and a second base layer on the insulation film;

forming a first electrode film on the first and second base layers;

forming a ferroelectric film on the first electrode film, the ferroelectric film comprising a metallic element found in the second base layer but not found in the first base layer;

forming a second electrode film on the ferroelectric film; and patterning the first electrode film, the ferroelectric film, and the second electrode film to form a plurality of first ferroelectric capacitors on the first base layer and a plurality of second ferroelectric capacitors on the second base layer.

The invention also provides an eighth method, based on the seventh method, wherein imprinting desired data further comprises applying predetermined voltages to the first ferroelectric capacitors to polarize the ferroelectric film therein, the applied voltages also altering hysteresis characteristics of the ferroelectric film in the first ferroelectric capacitors.

The invention also provides a ninth method, based on the seventh method, wherein the second base layer is formed on the first base layer, and forming the second base layer further comprises patterning the second base layer to remove the second base layer from a region in which the first ferroelectric capacitors will be formed.

The invention also provides a tenth method, based on the seventh method, further comprising:

forming a plurality of first semiconductor devices and a plurality of second semiconductor devices on the semiconductor substrate;

interconnecting the first semiconductor devices to the first ferroelectric capacitors to form a read-only memory region; and interconnecting the second semiconductor devices to the second ferroelectric capacitors to form a read-write memory region.

Those skilled in the art will recognize that further variations are possible within the scope of the invention, which is defined by the appended claims.

What is claimed is:

1. A ferroelectric memory device comprising:
 a first ferroelectric memory cell including a first ferroelectric film having a first imprint characteristic, a first base layer including a chemical element absent from the first ferroelectric film, and a first lower electrode disposed between the first ferroelectric film and the first base layer; and
 a second ferroelectric memory cell including a second ferroelectric film having a second imprint characteristic weaker than the first imprint characteristic, a second base layer including a chemical element present in the second ferroelectric film, and a second lower electrode disposed between the second ferroelectric film and the second base layer.

2. The ferroelectric memory device of claim 1, wherein the first ferroelectric film and the second ferroelectric film comprise $SrBi_2Ta_2O_9$, the first base layer comprises titanium oxide, and the second base layer comprises tantalum oxide.

3. A ferroelectric memory device comprising:
 a first ferroelectric memory cell including a first ferroelectric film having a first imprint characteristic; and
 a second ferroelectric memory cell including a second ferroelectric film having a second imprint characteristic weaker than the first imprint characteristic,
 wherein the second ferroelectric memory cell stores data that can be written and erased by applying voltages in a predetermined operating voltage range, and the first ferroelectric memory cell stores data that cannot be altered by application of voltages in the predetermined operating voltage range.

4. A ferroelectric memory device comprising:
a first ferroelectric memory cell including a first ferroelectric film having a first imprint characteristic, a titanium oxide base layers, and a first lower electrode disposed between the first ferroelectric film and the titanium oxide base layer; and
a second ferroelectric memory cell including a second ferroelectric film having a second imprint characteristic weaker than the first imprint characteristic, a tantalum oxide base layer, and a second lower electrode disposed between the second ferroelectric film and the tantalum oxide base layer.

5. A ferroelectric memory device comprising:
a first region including a plurality of first ferroelectric memory cells, each of the first ferroelectric memory cells including a first ferroelectric film having a first imprint characteristic; and
a second region including a plurality of second ferroelectric memory cells, each of the second ferroelectric memory cells including a second ferroelectric film having a second imprint characteristic weaker than the first imprint characteristic.

* * * * *